(12) United States Patent
Hsiao et al.

(10) Patent No.: US 10,510,644 B2
(45) Date of Patent: *Dec. 17, 2019

(54) PACKAGE STRUCTURES AND METHODS FOR FORMING THE SAME

(71) Applicant: Taiwan Semiconductor Manufacturing Company, Ltd., Hsinchu (TW)

(72) Inventors: Ching-Wen Hsiao, Hsinchu (TW); Ming-Da Cheng, Jhubei (TW); Chih-Wei Lin, Zhubei (TW); Chen-Shien Chen, Zhubei (TW); Chih-Hua Chen, Zhubei (TW); Chen-Cheng Kuo, Chu-Pei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/620,130

(22) Filed: Jun. 12, 2017

(65) Prior Publication Data

US 2017/0278777 A1    Sep. 28, 2017

Related U.S. Application Data

(62) Division of application No. 13/298,102, filed on Nov. 16, 2011, now Pat. No. 9,679,836.

(51) Int. Cl.
*H01L 23/498* (2006.01)
*H01L 23/31* (2006.01)
*H01L 21/683* (2006.01)
*H01L 25/10* (2006.01)
*H01L 23/00* (2006.01)

(52) U.S. Cl.
CPC .... *H01L 23/49816* (2013.01); *H01L 21/6835* (2013.01); *H01L 23/3128* (2013.01);
(Continued)

(58) Field of Classification Search
CPC .......... H01L 23/49816; H01L 23/3128; H01L 24/13; H01L 25/117; H01L 23/49822; H01L 24/16; H01L 2224/13011
See application file for complete search history.

(56) References Cited

U.S. PATENT DOCUMENTS 7,372,151 B1    5/2008  Fan et al.
7,446,419 B1 *  11/2008 Lin ...................... H01L 21/568
                                                        257/777

(Continued)

FOREIGN PATENT DOCUMENTS

CN    1445851 A     10/2003
CN    101083243 A   12/2007
CN    101630148 A   1/2010

OTHER PUBLICATIONS

Prashant, M., et al., "Next Generation eWLB (embedded Wafer Level BGA) Packaging," 2010 12th Electronics Packaging Technology Conference, Dec. 8-10, 2010, 8 pages.

*Primary Examiner* — Jamie C Niesz
(74) *Attorney, Agent, or Firm* — Slater Matsil, LLP

(57) ABSTRACT

A device includes a redistribution line, and a polymer region molded over the redistribution line. The polymer region includes a first flat top surface. A conductive region is disposed in the polymer region and electrically coupled to the redistribution line. The conductive region includes a second flat top surface not higher than the first flat top surface.

20 Claims, 6 Drawing Sheets

(52) U.S. Cl.
CPC ...... *H01L 23/49822* (2013.01); *H01L 25/105* (2013.01); *H01L 24/16* (2013.01); *H01L 2221/68318* (2013.01); *H01L 2221/68345* (2013.01); *H01L 2221/68381* (2013.01); *H01L 2224/131* (2013.01); *H01L 2224/16225* (2013.01); *H01L 2225/1023* (2013.01); *H01L 2225/1058* (2013.01); *H01L 2924/12042* (2013.01); *H01L 2924/15311* (2013.01); *H01L 2924/15331* (2013.01); *H01L 2924/18161* (2013.01)

(56) References Cited

U.S. PATENT DOCUMENTS

| | | | |
|---|---|---|---|
| 9,679,836 B2 * | 6/2017 | Hsiao | H01L 23/49822 |
| 2004/0212099 A1 * | 10/2004 | Klein | H01L 21/563 |
| | | | 257/778 |
| 2006/0046350 A1 * | 3/2006 | Jiang | H01L 23/49816 |
| | | | 438/114 |
| 2007/0273049 A1 * | 11/2007 | Khan | H01L 21/56 |
| | | | 257/787 |
| 2008/0308917 A1 | 12/2008 | Pressel et al. | |
| 2009/0085185 A1 | 4/2009 | Byun et al. | |
| 2009/0146301 A1 | 6/2009 | Shimizu et al. | |
| 2009/0315190 A1 | 12/2009 | Kikuchi et al. | |
| 2010/0059885 A1 | 3/2010 | Kuan et al. | |
| 2010/0072599 A1 | 3/2010 | Camacho et al. | |
| 2010/0072618 A1 | 3/2010 | Camacho et al. | |
| 2010/0171205 A1 | 7/2010 | Chen et al. | |
| 2010/0178761 A1 | 7/2010 | Chen et al. | |
| 2012/0286407 A1 | 11/2012 | Choi et al. | |
| 2013/0105973 A1 | 5/2013 | Gan et al. | |

* cited by examiner

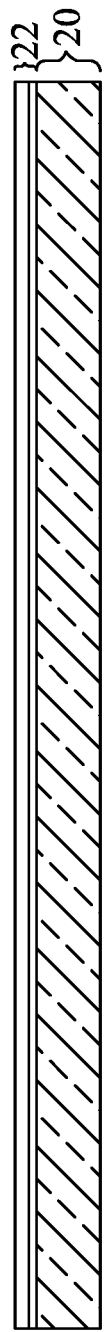
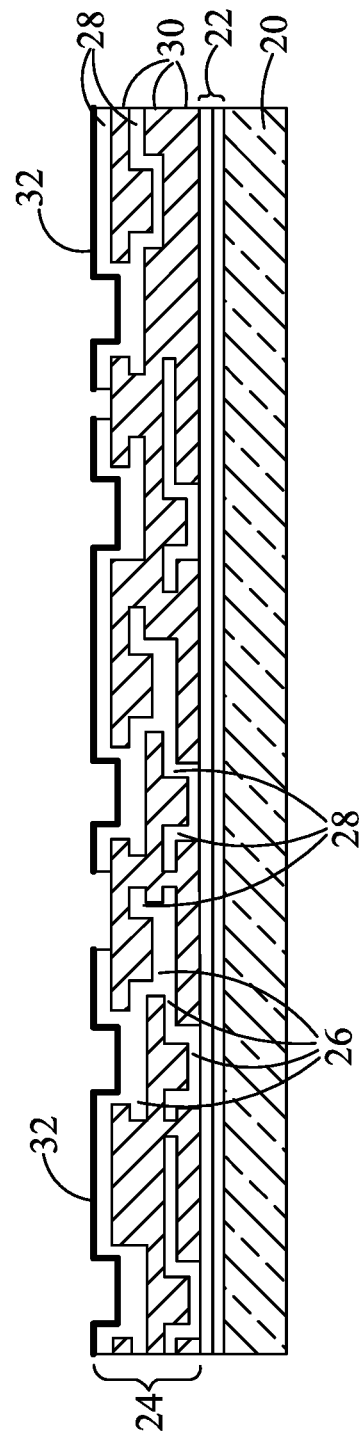

PACKAGE STRUCTURES AND METHODS FOR FORMING THE SAME

PRIORITY CLAIM AND CROSS-REFERENCE

This application is a divisional of U.S. patent application Ser. No. 13/298,102, entitled "Package Structures and Methods for Forming the Same," filed on Nov. 16, 2011, which application is incorporated herein by reference.

BACKGROUND

The fabrication of modern integrated circuits typically involves several steps. Integrated circuits are first fabricated on a semiconductor wafer, which contains multiple duplicated semiconductor chips, each comprising integrated circuits therein. The semiconductor chips are then sawed from the wafer and packaged. The packaging processes have two main purposes: to protect delicate semiconductor chips, and to connect interior integrated circuits to exterior pins.

In conventional packaging processes, a semiconductor chip may be mounted on a package component using flip-chip bonding. An Underfill is dispensed into the gap between the semiconductor chip and the package component to prevent cracks from being formed in solder bumps or solder balls, wherein cracks are typically caused by thermal stresses. The package component may be an interposer that includes metal connections for routing electrical signals between opposite sides. The chip may be bonded to the interposer through direct metal bonding, solder bonding, or the like.

With the increasing demand for more functions, package-on-package (PoP) technology is used to further expand the integration ability of the packages. When the PoP technology is used, packages are stacked. There are various designs regarding how the PoP structures can be formed. By using the PoP technology, the package design becomes more flexible and less complex. Time-to-market is also reduced for product upgrades. With a high degree of integration, the electrical performance of the resulting package is also improved due to the shortened connecting paths between the package components.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 10 are cross-sectional views of intermediate stages in the formation of a package in accordance with various embodiments.

DETAILED DESCRIPTION

Figure 3:
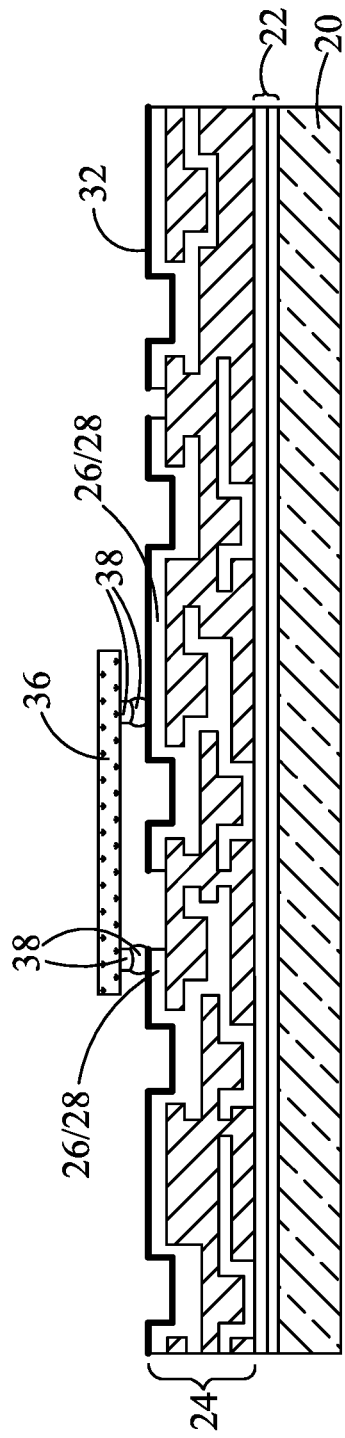

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A package structure and the method of forming the same are provided in accordance with various embodiments. The intermediate stages of forming the package structure are illustrated. The variations of the embodiments are discussed. Throughout the various views and illustrative embodiments, like reference numbers are used to designate like elements.

FIGS. 1 through 10 illustrate the cross-sectional views of intermediate stages in the manufacturing of a package in accordance with embodiments. FIG. 1 illustrates carrier 20 and release layer 22 formed on carrier 20. Carrier 20 may be a glass carrier, a ceramic carrier, or the like. Release layer 22 may be formed of a polymer-based material, which is capable of being removed later, so that the structures formed over release layer 22 may be demounted from carrier 20. Release layer 22 may be formed of a thermal-release, chemical-release, UV-release, or laser-release material. In some embodiments, release layer 22 is dispensed as a liquid, and is then cured. The top surface of release layer 22 is leveled to have a high degree of co-planarity. In alternative embodiments, release layer 22 is a laminate film, and is laminated onto carrier 20.

Referring to FIG. 2, redistribution layers 24 are formed on release layer 22. Redistribution layers 24 include metal lines 26 and vias 28 interconnecting metal lines 26, wherein metal lines 26 and vias 28 are formed in inter-layer dielectrics (ILDs) 30. Metal lines 26 and vias 28 are referred to as redistribution lines (RDLs) 26/28 hereinafter. The bottom layer of redistribution layers 24 may be in contact with the top surface of release layer 22. In an embodiment, RDLs 26/28 may be formed of metals or metal alloys, such as copper, aluminum, aluminum copper, nickel, or the like. ILDs 30 may be formed of a photo-sensitive material such as polyimide or polybenzoxazole (PBO). Alternatively, ILDs 30 are formed of a nitride such as silicon nitride. In yet other embodiments, ILDs 30 may be formed of an oxide such as silicon oxide, phosphosilicate glass (PSG), borosilicate glass (BSG), boron-doped phosphosilicate glass (BPSG), or the like. In accordance with some exemplary embodiments, the formation of RDLs 26/28 and ILDs 30 may include forming and patterning one of ILDs 30, depositing a metal layer, and then patterning the metal layer. Alternatively, a damascene process may be used, which includes forming ILD 30 as a blank layer, forming openings in the respective ILDs 30, filling a metallic material in the respective ILDs 30, and performing a chemical mechanical polish (CMP).

In an embodiment, metal finish 32 may be formed optionally as a portion of the top layer of RDLs 26/28. In some embodiments, metal finish 32 may be a nickel layer. In other embodiments, metal finish 32 may be formed of materials and methods, including, but not limited to, electro-less nickel immersion gold (ENIG), electro-less nickel electro-less gold (ENEG), electro-less nickel electro-less palladium immersion gold (ENEPIG), direct immersion gold (DIG), immersion tin, or the like.

In alternative embodiments, instead of forming redistribution layers 24 starting from release layer 22, redistribution layers 24 may be pre-formed and attached onto release layer 22. In some embodiments, a package substrate may be used as redistribution layers 24.

Referring to FIG. 3, package component 36 is bonded to metal layers 24. In some embodiments, package component 36 is a device die including active devices such as transistors (not shown) therein. In Alternative embodiments, package component 36 is a package that comprises a device die bonded to an interposer, a package substrate, or the like. The bonding of package component 38 to metal layers 24 may be performed through connectors 38, which may include solder regions, metal pillar, metal pads, and/or the like. The bonding may be solder bonding, metal pillar to metal pillar bonding, Bum-on-Trace (BOT) bonding, or the like.

Figure 4:
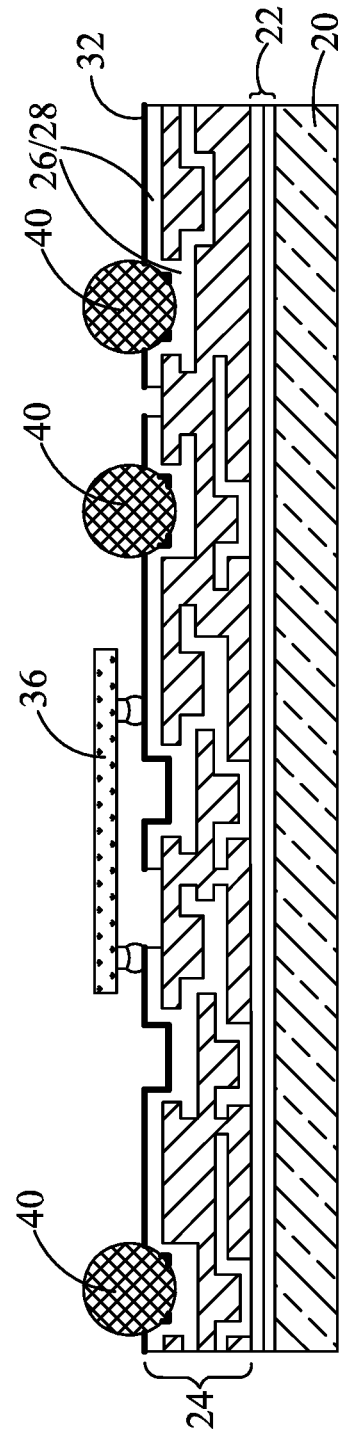

FIG. 4 illustrates the formation of Z-interconnectors 40, which are named due to their function of connecting features in the direction (Z-direction), which is perpendicular to the major top surface of redistribution layers 24. Z-interconnectors 40 are alternatively referred to as connectors 40 throughout the description. In the resulting structure, at least top portions, and possibly entireties, of Z-interconnectors 40 comprise solder regions that have round top surfaces. In some embodiments, Z-interconnectors 40 are solder balls, and are placed on metal finish 32/RDLs 26/28, and then reflowed. Accordingly, the formation of the respective Z-interconnectors 40 may include placing and reflowing Z-interconnectors 40. In alternative embodiments, Z-interconnectors 40 may have other structures comprising, for example, metal pillars and solder caps on the metal pillars. Accordingly, the formation of the respective Z-interconnectors 40 may include forming a mask layer (not shown), forming openings in the mask layer, plating the metal pillars and the solder caps, and removing the mask layer. The solder caps may then be reflowed. As shown in FIG. 4, one of top RDLs 26 includes a first end portion overlapped by, and bonded to, package component 36, a second end having a recess, with Z-interconnector 40 in the recess, and an intermediate portion connecting the first end portion to the second end portion. Metal finish 32 continuous extends through the first end portion, the second end portion, and the intermediate portion.

Figure 5:
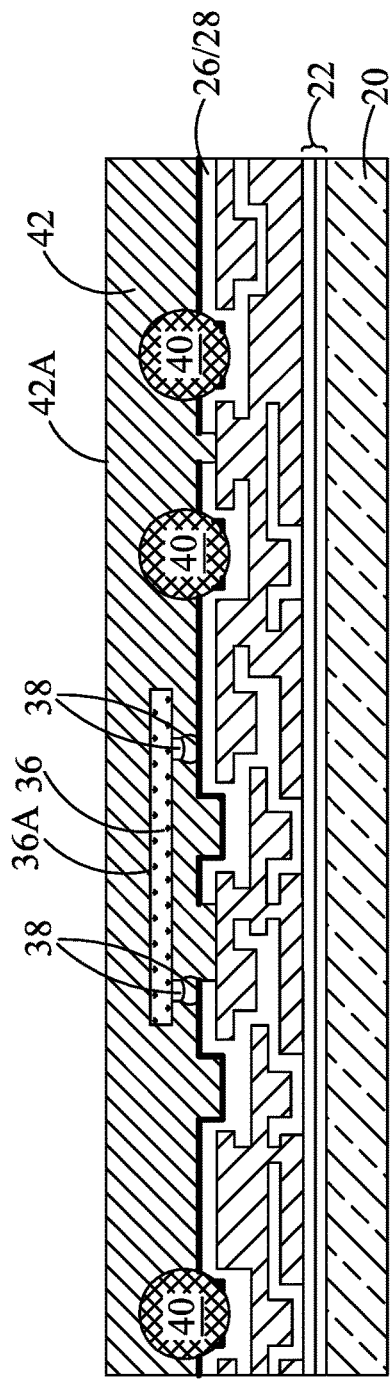

FIG. 5 illustrates the molding of polymer region 42, which may comprise a molding compound, a molding underfill, an epoxy, or the like. Polymer region 42 covers package component 36 and Z-interconnectors 40, with top surface 42A of polymer region 42 higher than top surface 36A of package component 36 and top surface 40A of Z-interconnectors 40, so that package component 36 and Z-interconnectors 40 are embedded in polymer region 42.

Figure 6:
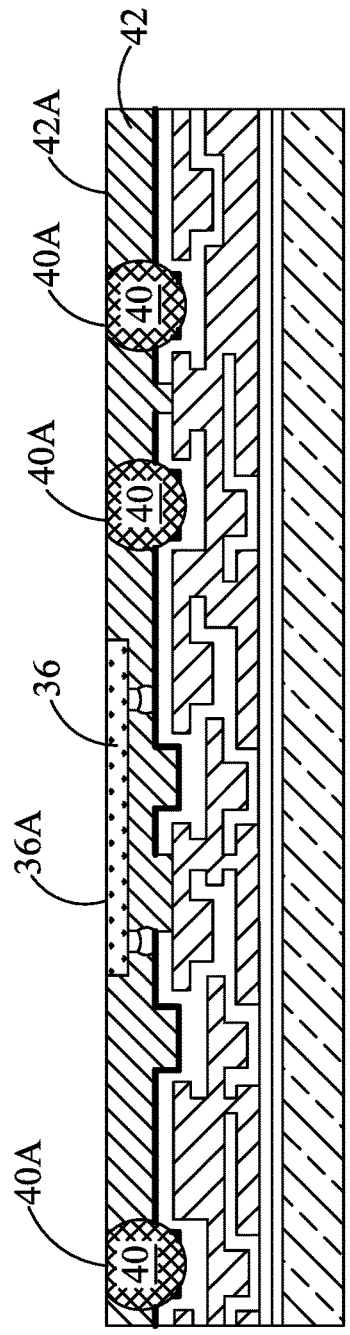

Referring to FIG. 6, a planarization, such as a grinding process, is performed to remove a top layer of polymer region 42. A top portion of each of Z-interconnectors 40 is also removed during the planarization. As a result, top surfaces 40A of Z-interconnectors 40 are flat, and are level with top surface 42A of polymer region 42. The sidewalls of Z-interconnectors 40, on the other hand, are in contact with polymer region 42, and are rounded. After the planarization, top surface 36A of package component 36 may be level with, or lower than, top surfaces 40A and 42A.

Figure 7:
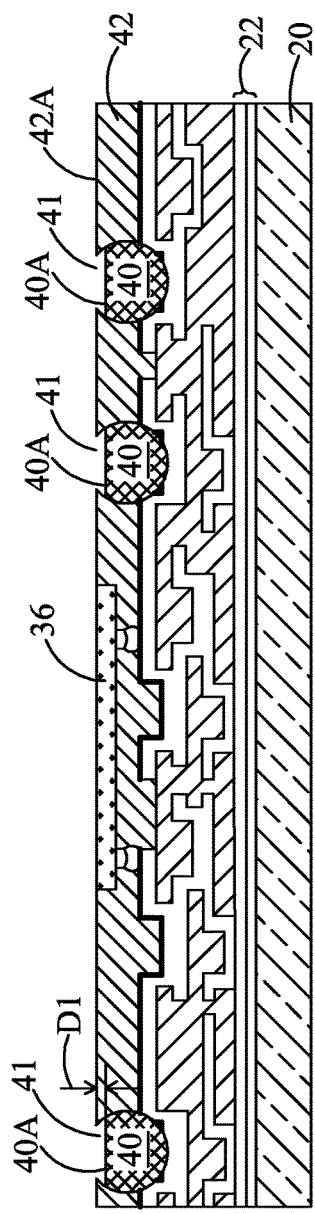

FIG. 7 illustrates the optional recessing of Z-interconnectors 40, wherein after the step as shown in FIG. 6 is formed, an etching step is performed using an etchant that attacks Z-interconnectors 40, and does not attack polymer region 42. Accordingly, recesses 41 are formed, and top surfaces 40A of Z-interconnectors 40 are lower than top surface 42A of polymer region 42. Top surfaces 40A remain to be substantially flat after the recessing of Z-interconnectors 40. In an exemplary embodiment, recessing depth D1, which is the height difference between top surfaces 40A and 42A, is greater than about 10 µm, for example, although different values may also be used.

Figure 8:
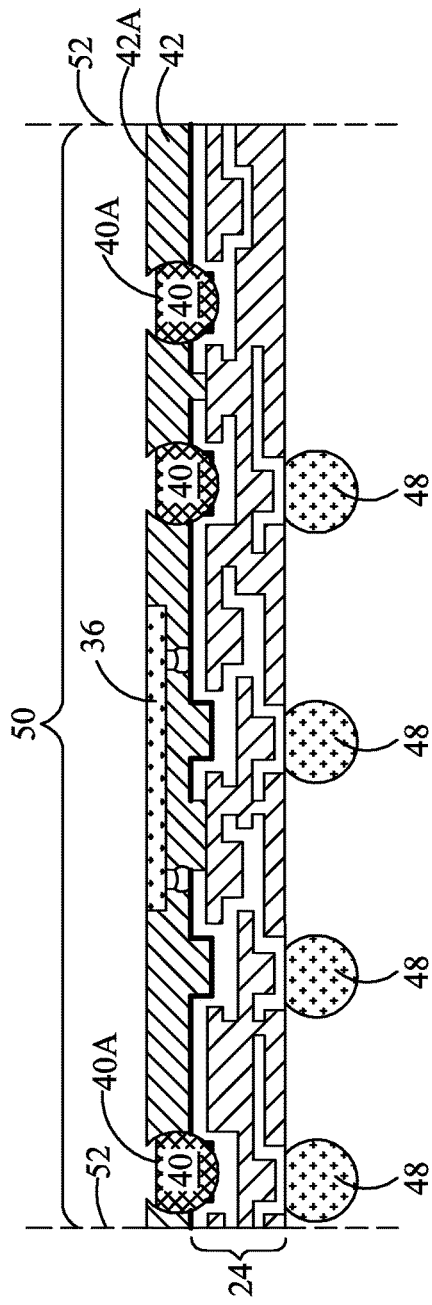

FIG. 8 illustrates the releasing of carrier 20 from redistribution layers 24 and the formation of connectors 48. In an embodiment, the releasing may be achieved by performing a step (such as a UV light exposure) to cause release layer 22 to lose adhesion, so that carrier 20 may be removed from release layer 22. Release layer 22 may then be removed, resulting in the structure shown in FIG. 8.

FIG. 8 also illustrates the formation of connectors 48 on the bottom layer of redistribution layers 24, wherein connectors 48 and Z-interconnectors 40 are on opposite sides of redistribution layers 24. In some embodiments, connectors 48 are solder balls, and are placed on the bottom layer of redistribution layers 24 and reflowed. A singulation may then be performed along scribe lines 52, so that a plurality of packages is formed, wherein each of the packages may be identical to the illustrated package 50.

Figure 9:
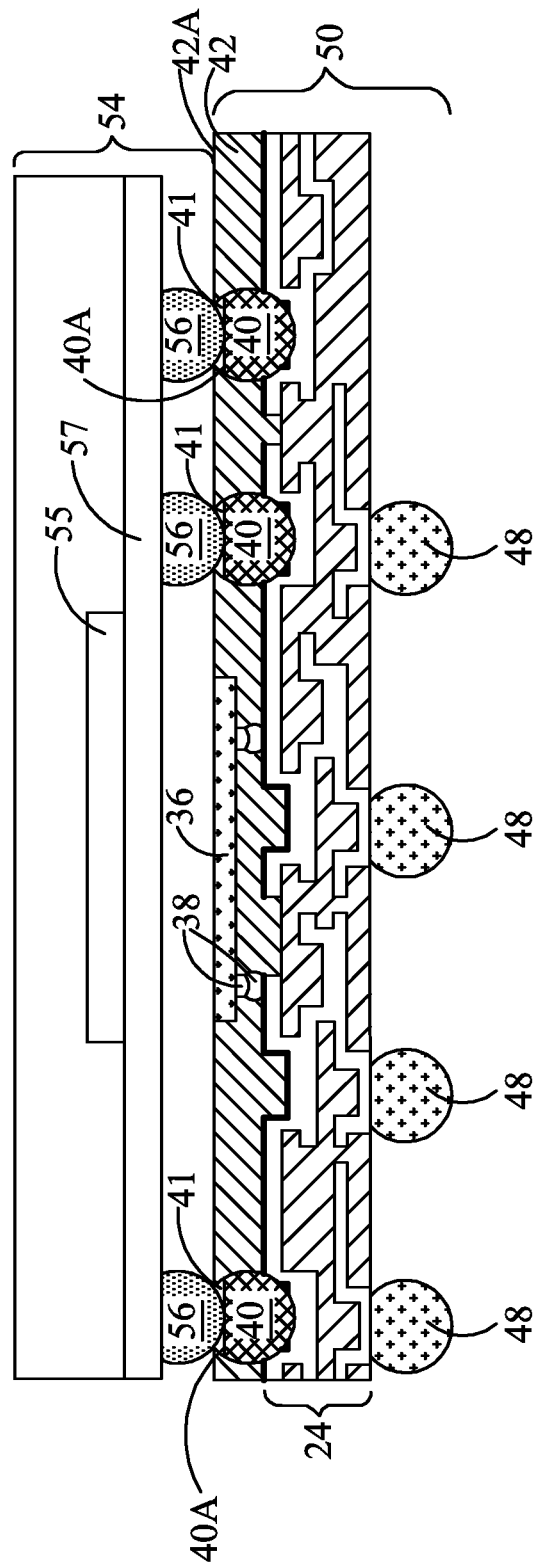
Figure 10:
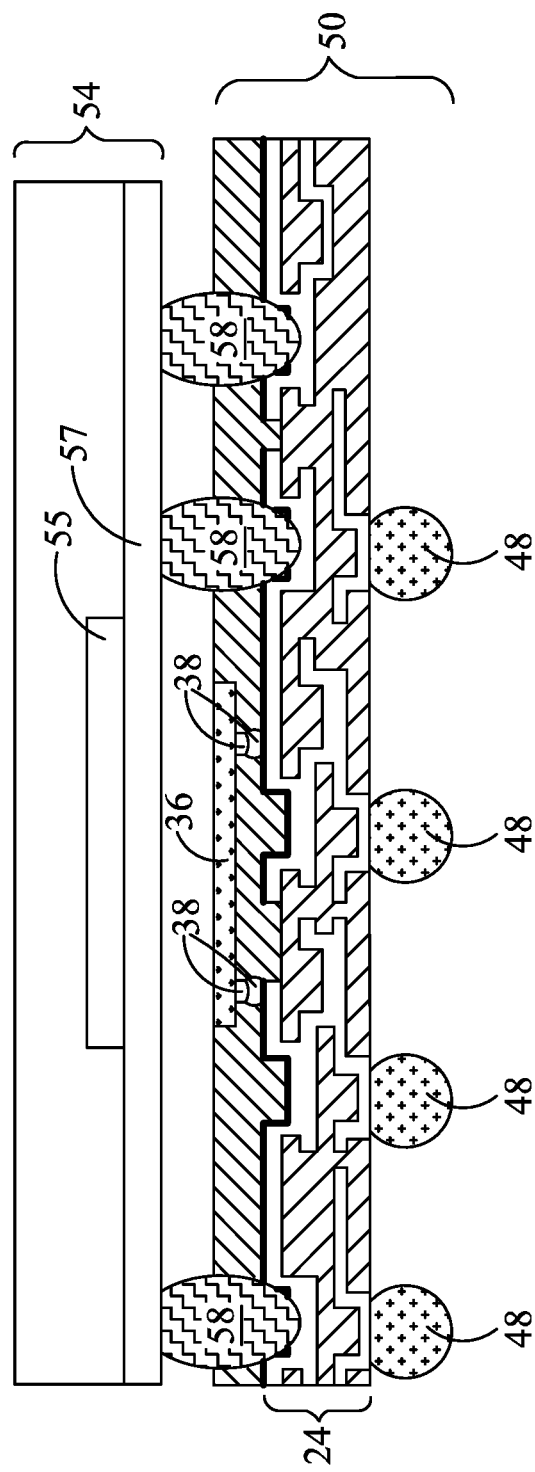

Next, as shown in FIGS. 9 and 10, package component 54 is bonded to package 50. As shown in FIG. 9, package component 54 is first placed on package 50, with connectors 56 of package component 54 residing on Z-interconnectors 40. In some embodiments, package component 54 is a package that includes device die 55 bonded to interposer (or package substrate) 57, and hence the resulting structure in FIG. 10 is a Package-on-Package (PoP) structure. In alternative embodiments, package component 54 may be another type of components such as a device die. Connectors 56 that are used for bonding may be solder balls, which have round surfaces, although connectors 56 may have other structures such as metal pillars and solder caps (balls) on the metal pillars. It is observed that since the top surfaces of Z-interconnectors 40 are flat, connectors 56 are unlikely to shift on Z-interconnectors 40. Furthermore, in the embodiments wherein the top surfaces of Z-interconnectors 40 are recessed from top surface 42A of polymer region 42, connectors 56 are better confined in recesses 41.

After the surface of connectors 56 are in contact with top surfaces 40A of Z-interconnectors 40, a reflow is performed to form connectors 58, which join package component 54 to package 50. The resulting structure is shown in FIG. 10.

It is observed that in the resulting structure in FIG. 10, recesses 41 as in FIG. 7 may further confine the molten solder during the reflow, so that the assembly yield for the packaging process is increased.

In accordance with embodiments, a device includes a redistribution line, and a polymer region molded over the redistribution line. The polymer region includes a first flat top surface. A solder region is disposed in the polymer region and electrically coupled to the redistribution line. The solder region includes a second flat top surface not higher than the first flat top surface.

In accordance with other embodiments, a device includes a redistribution line, and a molding compound molded over the redistribution line, wherein the molding compound comprises a first flat top surface. A solder ball is disposed in the molding compound, wherein the solder ball is over and bonded to the redistribution line. The solder ball includes round sidewalls and a second flat top surface not higher than the first flat top surface. A die is disposed over and bonded to the redistribution line, and is located in the molding compound. A top surface of the die is not higher than the first flat top surface.

In accordance with yet other embodiments, a method includes forming a connector over and electrically coupled to a redistribution line, wherein the connector include a solder region having a round top surface. A polymer region is molded to cover the connector and the redistribution line. The polymer region and the solder region are then grinded, until the solder region forms a first top surface level with a second top surface of the polymer region.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   forming a redistribution structure over a carrier, wherein the redistribution structure comprises dielectric layers and redistribution lines extending into the dielectric layers, wherein a redistribution line in the redistribution structure forms a first recess and a second recess, and the redistribution line comprises a first portion underlying the first recess, and second portions forming sidewalls of the first recess;
   bonding a device die to the redistribution lines;
   attaching a conductive region onto the redistribution lines, wherein the conductive region extends into the first recess and is in contact with a top surface of the first portion and sidewall surfaces of the second portions of the first recess;
   encapsulating the device die and the conductive region in an encapsulating material, wherein the encapsulating material extends into the second recess;
   performing a planarization step to reveal the conductive region; and
   de-mounting the device die and the redistribution structure from the carrier after the planarization step.

2. The method of claim 1 further comprising, after the planarization step, further recessing the planarized conductive region to form a recess, wherein the recess extends into the encapsulating material.

3. The method of claim 2, wherein the recessing the planarized conductive region comprises etching the planarized conductive region.

4. The method of claim 2 further comprising:
   placing a package component, wherein an additional conductive region of the package component has a bottom portion placed into the recess; and
   performing a reflow to join the conductive region to the additional conductive region.

5. The method of claim 1, wherein the encapsulating material encapsulates an entirety of the device die, and the planarization step also reveals the device die.

6. The method of claim 1 further comprising forming a release layer on the carrier, wherein the redistribution structure is formed over the release layer, and in the de-mounting, the release layer is removed from the redistribution structure.

7. The method of claim 2, wherein the encapsulating material comprises an edge portion overlapping an edge portion of the conductive region, and the edge portion has a top surface, and after the recessing the planarized conductive region, a top surface of the conductive region is lower than the top surface of the edge portion of the encapsulating material.

8. A method comprising:
   forming a redistribution structure comprising a redistribution line over a release layer, with the release layer being further located on a carrier, wherein the redistribution structure forms a first recess and a second recess, and the redistribution line comprises a first portion underlying each of the first recess and the second recess, and sidewalls of the redistribution line form sidewalls of each of the first recess and the second recess;
   forming an electrical connector over and electrically coupling to the redistribution line, wherein the electrical connector comprises a conductive region having a round top surface, and the electrical connector extends into the first recess;
   molding the electrical connector in a molding compound, wherein the molding compound extends into the second recess;
   grinding the molding compound and the conductive region, until the conductive region has a first top surface level with a second top surface of the molding compound; and
   etching the grinded conductive region to recess the first top surface of the conductive region to a level lower than the second top surface of the molding compound.

9. The method of claim 8, wherein the forming the electrical connector comprises:
   placing a solder ball on the redistribution line; and
   reflowing the solder ball.

10. The method of claim 8 further comprising, after the grinding, bonding a package component to the electrical connector.

11. The method of claim 8 further comprising:
    after the grinding, demounting the carrier from the redistribution structure.

12. The method of claim 8 further comprising, before the molding, bonding a die onto an additional redistribution line of the redistribution structure, wherein after the molding, the die is molded in the molding compound.

13. The method of claim 8, wherein the redistribution line is in a top redistribution layer of a plurality of redistribution layers, and wherein the method further comprises forming an additional electrical connector attached to a bottom layer of the plurality of redistribution layers.

14. The method of claim 8, wherein the molding compound comprises an edge portion overlapping an edge portion of the conductive region, and the edge portion has a top surface, and after the grinded conductive region is etched, a top surface of the conductive region is lower than the top surface of the edge portion of the molding compound.

15. A method comprising:
    forming a redistribution structure comprising a redistribution line over a release layer, with the release layer being further located on a carrier, wherein the redistribution structure forms a first recess and a second recess, and the redistribution line comprises a first portion underlying each of the first recess and the second recess, and the redistribution line forms sidewalls of each of the first recess and the second recess;
    disposing a first conductive region extending into the first recess;
    encapsulating a device die and the first conductive region in an encapsulating material to form a first package, wherein the device die and the first conductive region are embedded in the encapsulating material, and the encapsulating material extends into the second recess;
    performing a planarization to reveal the first conductive region and a top surface of the device die;

after the planarization, recessing the first conductive region; and bonding a second package to the first package through the first conductive region.

16. The method of claim 15, wherein in the bonding the second package to the first package, a second conductive region of the second package is in contact with a top surface of the recessed first conductive region.

17. The method of claim 16, wherein the recessing the first conductive region comprises etching the first conductive region.

18. The method of claim 17, wherein when the first conductive region is etched, the encapsulating material is not etched.

19. The method of claim 15 further comprising:
bonding the device die and the first conductive region to the redistribution structure.

20. The method of claim 15, wherein the redistribution structure is formed over a carrier, and the method further comprises de-mounting the carrier from the redistribution structure after the encapsulating the device die.

* * * * *